(12) United States Patent
Shin

(10) Patent No.: US 7,945,010 B2
(45) Date of Patent: May 17, 2011

(54) APPARATUS AND METHOD FOR COMPENSATING FOR PHASE JUMP OF REFERENCE SIGNAL IN DIGITAL PHASE-LOCKED LOOP/FREQUENCY-LOCKED LOOP

(75) Inventor: Seung-Woo Shin, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 657 days.

(21) Appl. No.: 12/032,033

(22) Filed: Feb. 15, 2008

(65) Prior Publication Data

US 2008/0198958 A1    Aug. 21, 2008

(30) Foreign Application Priority Data

Feb. 16, 2007  (KR) .................. 10-2007-0016660

(51) Int. Cl.
*H04L 7/00* (2006.01)
(52) U.S. Cl. ...................................................... 375/371
(58) Field of Classification Search .................. 375/215, 375/294, 327, 376; 342/103; 370/503; 455/180.3, 455/266; 327/141, 146, 147, 148, 149, 150, 327/156, 157, 158, 159
See application file for complete search history.

(56) References Cited

U.S. PATENT DOCUMENTS

| | | | |
|---|---|---|---|
| 6,255,858 B1 * | 7/2001 | Akiyama et al. ................. 327/12 |
| 7,136,445 B2 * | 11/2006 | Houtman ....................... 375/375 |
| 7,535,271 B2 * | 5/2009 | Kizer ............................ 327/156 |
| 2004/0071168 A1 * | 4/2004 | Julyan ........................... 370/503 |
| 2004/0076246 A1 * | 4/2004 | Vanderperren et al. ........ 375/343 |

* cited by examiner

*Primary Examiner* — Sam K Ahn
(74) *Attorney, Agent, or Firm* — Jefferson IP Law, LLP

(57) ABSTRACT

An apparatus and method for compensating for a phase jump of a reference signal in a digital Phase-Locked Loop (PLL)/Frequency-Locked Loop (FLL) are provided. The apparatus includes a phase discriminator for comparing a phase of an external clock signal (i.e., the reference signal) with a phase of an internal clock signal to determine a phase difference between the two signals, a phase jump compensator for detecting a phase jump moment by using the phase difference, for estimating a previous phase jump value according to a current phase difference upon detecting a phase jump, and for correcting the phase difference by using a phase jump correction value obtained in the estimation process, and a Low Pass Filter (LPF) for filtering a high-frequency component of the corrected phase difference. Accordingly, reliable synchronization can be achieved over an E1/T1 network.

15 Claims, 5 Drawing Sheets

APPARATUS AND METHOD FOR COMPENSATING FOR PHASE JUMP OF REFERENCE SIGNAL IN DIGITAL PHASE-LOCKED LOOP/FREQUENCY-LOCKED LOOP

PRIORITY

This application claims the benefit under 35 U.S.C. §119 (a) of a Korean patent application filed in the Korean Intellectual Property Office on Feb. 16, 2007 and assigned Serial No. 2007-16660, the entire disclosure of which is hereby incorporated by reference.

BACKGROUND OF THE INVENTION

1. Field of the Invention

The present invention relates to a digital Phase-Locked Loop (PLL)/Frequency-Locked Loop (FLL). More particularly, the present invention relates to an apparatus and method for compensating for a phase difference generated when a phase jump occurs in a reference signal.

2. Description of the Related Art

A digital Phase-Locked Loop (PLL)/Frequency-Locked Loop (FLL) is a widely used function in a communication field to synchronize an internal clock signal with an external clock signal (i.e., a reference signal).

In a conventional PLL/FLL implementation, the reference signal is obtained from an upper-layer system over an E1/T1 network. In this case, Bit Justification (BJ) and Pointer Adjustment (PA) occur, which result in jitter and phase jump of the reference signal and affects PLL/FLL performance. Therefore, in order to ensure adequate PLL/FLL performance, there is a need to compensate for phase jump of the reference signal. However, the conventional PLL/FLL implementation cannot provide a compensation function that sufficiently compensates for the phase jump.

SUMMARY OF THE INVENTION

An aspect of the present invention is to address at least the above-mentioned problems and/or disadvantages and to provide at least the advantages described below. Accordingly, an aspect of the present invention is to provide an apparatus and method for compensating for a phase jump of a reference signal in a Phase-Locked Loop (PLL)/Frequency-Locked Loop (FLL).

Another aspect of the present invention is to provide an apparatus and method for providing a reliable PLL/FLL output signal by estimating a value indicating a jump moment and a value indicating a jump level in a process of dealing with a phase difference between an external clock signal (i.e., a reference signal) and an internal clock signal and by compensating for the evaluated values.

According to an aspect of the present invention, an apparatus for compensating for a phase jump of a reference signal is provided. The apparatus includes a phase discriminator for comparing a phase of an external clock signal (i.e., a reference signal) with a phase of an internal clock signal to determine a phase difference between the two signals, a phase jump compensator for detecting a phase jump moment by using the phase difference, for estimating a previous phase jump value according to a current phase difference upon detecting a phase jump, and for correcting the phase difference by using a phase jump correction value obtained in the estimation process, and a Low Pass Filter (LPF) for filtering a high-frequency component of the corrected phase difference.

According to another aspect of the present invention, a method of compensating for a phase jump of a reference signal is provided. The method includes comparing a phase of an external clock signal (i.e., a reference signal) with a phase of an internal clock signal to determine a phase difference between the two signals, detecting a phase jump moment by using the phase difference, estimating a previous phase jump value according to a current phase difference upon detecting a phase jump, and correcting the phase difference by using a phase jump correction value obtained in the estimation process, and filtering a high-frequency component of the corrected phase difference.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will become more apparent from the following detailed description taken in conjunction with the accompanying drawings in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the present invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Hereinafter, an apparatus and method for compensating for a phase jump of a reference signal in a Phase-Locked Loop (PLL)/Frequency-Locked Loop (FLL) will be described.

Figure 1:
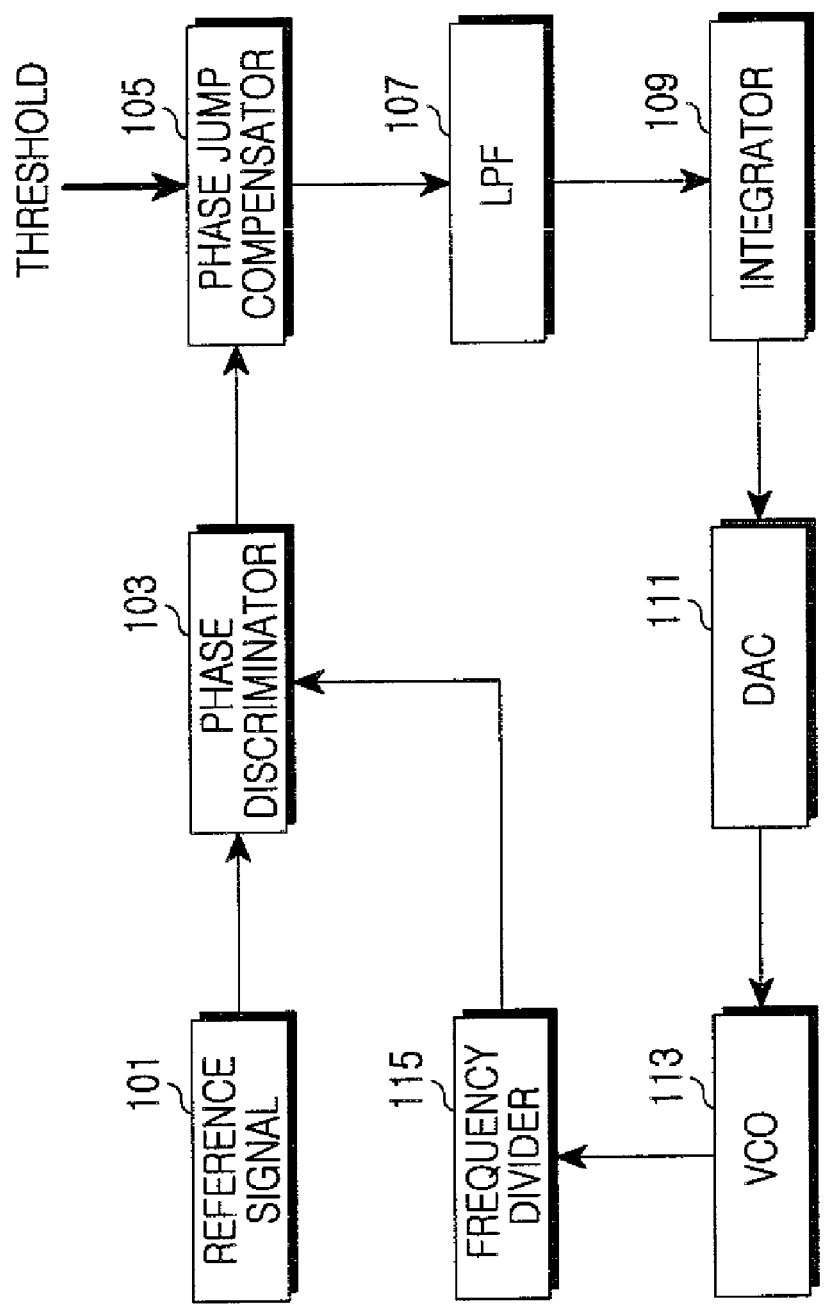
FIG. 1 is a block diagram illustrating a digital Phase-Locked Loop (PLL)/Frequency-Locked Loop (FLL) apparatus according to an exemplary embodiment of the present invention.

FIG. 1 is a block diagram illustrating a digital PLL/FLL apparatus according to an exemplary embodiment of the present invention. The PLL/FLL apparatus includes a phase discriminator 103, a phase jump compensator 105, a Low Pass Filter (LPF) 107, an integrator 109, a Digital-to-Analog Converter (DAC) 111, a Voltage-Controlled-Oscillator (VCO) 113, and a frequency divider 115.

Referring to FIG. 1, the phase discriminator 103 compares a phase of an external clock signal (i.e., a reference signal) 101 with a phase of an internal clock signal input from the frequency divider 115, determines a phase difference between the two signals and outputs the determined phase difference to the phase jump compensator 105.

The phase jump compensator 105 uses the phase difference input from the phase discriminator 103 to detect a phase jump moment. Upon detecting a phase jump, the phase jump compensator 105 estimates a previous phase jump value according to a current phase difference. Thereafter, the phase jump compensator 105 corrects the phase difference by using a phase jump correction value obtained in the estimation process, and then outputs the corrected phase difference to the LPF 107.

The LPF 107 filters a high-frequency component of the phase difference input from the phase jump compensator 105, and then outputs the filtered phase difference to the integrator 109.

The integrator 109 integrates the filtered phase difference input from the LPF 107 to generate voltage or current which is in proportion to the phase difference, and then outputs the generated voltage or current to the DAC 111.

The DAC 111 converts the digital voltage or current input from the integrator 109 into analog voltage or current, and then outputs the analog voltage or current to the VCO 113.

By using the voltage or current input from the DAC 111, the VCO 113 outputs a frequency corresponding to the phase difference to the frequency divider 115.

The frequency divider 115 receives the frequency corresponding to the phase difference from the VCO 113, adequately divides the received frequency to facilitate phase comparison to be performed by the phase discriminator 103, and then outputs the division result to the phase discriminator 103.

Figure 2:
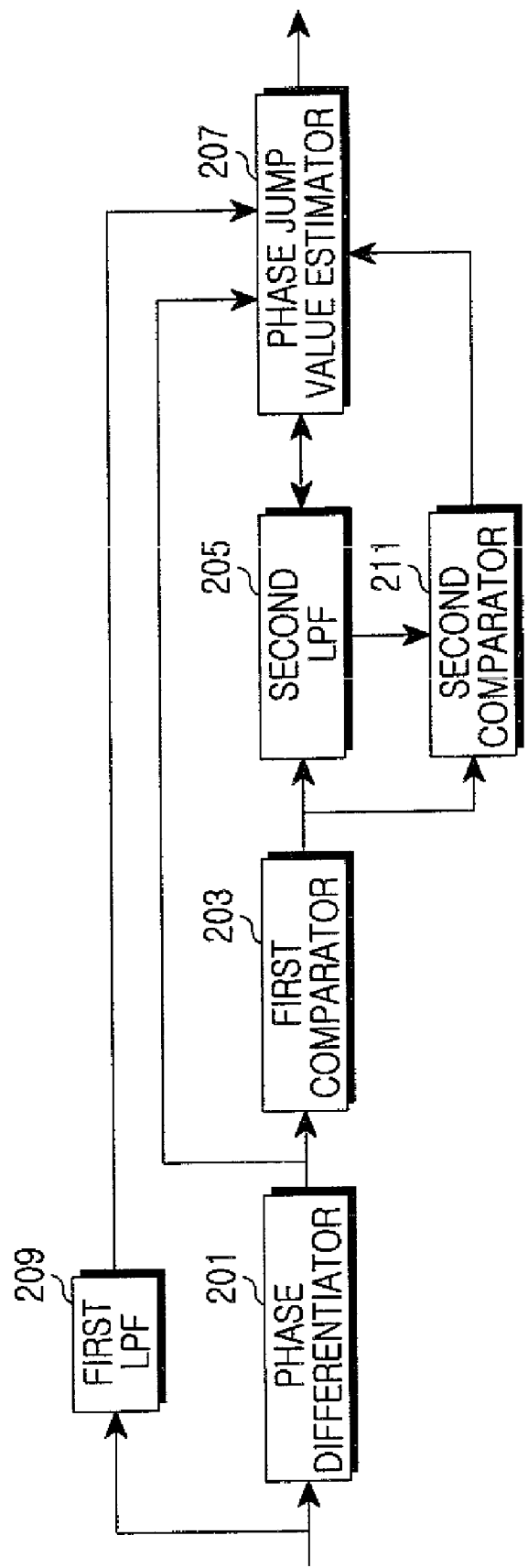
FIG. 2 is a block diagram illustrating a phase jump compensator according to an exemplary embodiment of the present invention.

FIG. 2 is a block diagram illustrating a phase jump compensator according to an exemplary embodiment of the present invention. The phase jump compensator includes a phase differentiator 201, a first comparator 203, a second LPF 205, a phase jump value estimator 207, a first LPF 209, and a second comparator 211.

Referring to FIG. 2, the phase differentiator 201 compares a phase difference input from the phase discriminator 103 of FIG. 1 with a previous phase difference so as to obtain a phase difference increment value. Then, the phase differentiator 201 outputs the obtained phase difference increment value to the first comparator 203 and the phase jump value estimator 207.

The first comparator 203 receives the phase difference increment value from the phase differentiator 201, and compares the received phase difference increment value with a threshold (i.e., 0) to divide the phase difference increment value into a positive phase difference increment value and a negative phase difference increment value, and outputs the resultant values to the second LPF 205 and the second comparator 211.

The second LPF 205 filters the positive phase difference increment value and the negative phase difference increment value which are input from the first comparator 203, and then respectively outputs the filtered increment values to the phase jump value estimator 207 and the second comparator 211.

The phase jump value estimator 207 buffers and stores the filtered phase difference input from the first LPF 209, the phase difference increment value input from the phase differentiator 201, the filtered positive phase difference increment value and the filtered negative phase difference increment value which are input from the second LPF 205. Upon detecting a phase jump from the second comparator 211, according to a currently filtered phase difference, the phase jump value estimator 207 estimates a previously detected phase jump value by using a value buffered and stored at a previous phase jump moment. Further, the phase jump value estimator 207 obtains a phase jump correction value by integrating the phase jump value obtained in the estimation process, calculates a difference between the filtered phase differences stored at the previous phase jump moment with the obtained phase jump correction value, and obtains a corrected output phase difference. Details of the phase jump value estimator 207 will be described below with reference to FIG. 3.

The first LPF 209 filters the phase difference input from the phase discriminator 103 of FIG. 1, and then outputs the filtered phase difference to the phase jump value estimator 207.

The second comparator 211 receives from the first comparator 203 the positive phase difference increment value and the negative phase difference increment value, and then receives from the second LPF 205 the filtered positive phase difference increment value and the filtered negative phase difference increment value. Thereafter, the second comparator 211 compares the positive phase difference increment value with the filtered positive phase difference increment value. If a difference between the two increment values is greater than a threshold, the second comparator 211 detects the phase jump. Further, the second comparator 211 compares the negative phase difference increment value with the filtered negative phase difference increment value, and if the difference between the two increment values is less than the threshold, detects the phase jump. Upon detecting the phase jump, the second comparator 211 outputs the detection result on the phase jump to the phase jump value estimator 207.

Figure 3:
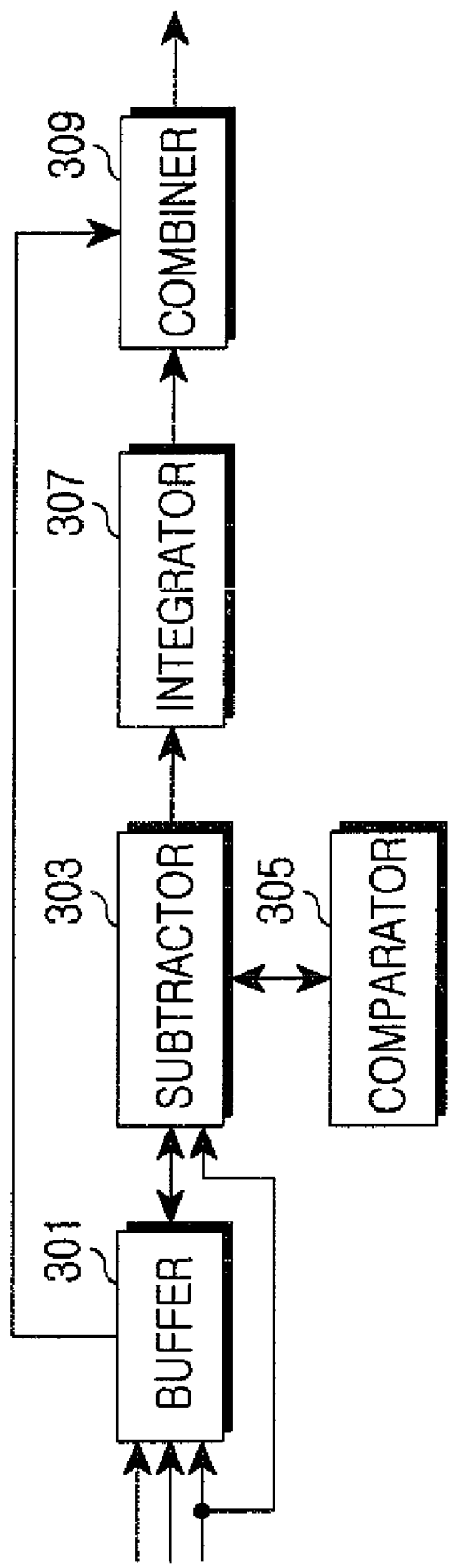
FIG. 3 is a block diagram illustrating a phase jump value estimator according to an exemplary embodiment of the present invention.

FIG. 3 is a block diagram illustrating a phase jump value estimator according to an exemplary embodiment of the present invention. The phase jump value estimator includes a buffer 301, a subtractor 303, a comparator 305, an integrator 307, and a combiner 309.

Referring to FIG. 3, the buffer 301 buffers and stores a filtered positive phase difference increment value and a filtered negative phase difference increment value which are input from the second LPF 205 of FIG. 2, a phase difference increment value input from the phase differentiator 201 of FIG. 2, and a filtered phase difference input from the first LPF 209 of FIG. 2. Then, the buffer 301 outputs the buffered and stored value to the subtractor 303 under the control of the subtractor 303, and outputs the filtered phase difference, which is buffered and stored, to the combiner 309 under the control of the combiner 309.

Upon detecting a phase jump by the second comparator 211 of FIG. 2, the subtractor 303 receives values buffered and stored at a previous phase jump moment. That is, the received values include the filtered positive phase difference increment value, the filtered negative phase difference increment value, the phase difference increment value, and the filtered phase difference. Then, according to the currently filtered phase difference, the subtractor 303 estimates a previously detected phase jump value. In other words, the subtractor 303 calculates and stores a difference A between the filtered positive phase difference increment value and the phase difference increment value, calculates and stores a difference B between the filtered negative phase difference increment value and the phase difference increment value, and calculates a difference C between values obtained before and after the filtered phase difference is buffered. Further, the subtractor 303 calculates a difference D between the difference A and the difference C, calculates a difference E between the difference B and the difference C, and then outputs the differences D and E to the comparator 305. Thereafter, when one of the differences D and E is selected by the comparator 305, the subtractor 303 outputs to the integrator 307 either the difference A and/or the difference B corresponding to the selected difference D or E as a phase jump value. In this case, the subtractor 303 resets the buffer 301.

The comparator 305 receives the differences D and E calculated by the subtractor 303, and then compares absolute values of the two differences D and E. If the absolute value of the difference D is less than the absolute value of the difference E, the comparator 305 outputs the difference D to the subtractor 303, and otherwise, outputs the difference E to the subtractor 303.

The integrator 307 integrates the phase jump value which is received from the subtractor 303 and is estimated as a previous phase jump, obtains a phase jump correction value, and outputs the obtained phase jump correction value to the combiner 309.

The combiner 309 receives from the buffer 301 a filtered phase difference which is stored at the previous phase jump moment, and receives from the integrator 307 the phase jump correction value. Then, the combiner 309 calculates a difference between the filtered phase difference and the phase jump correction value, and thus obtains a corrected output phase difference.

Figure 4:
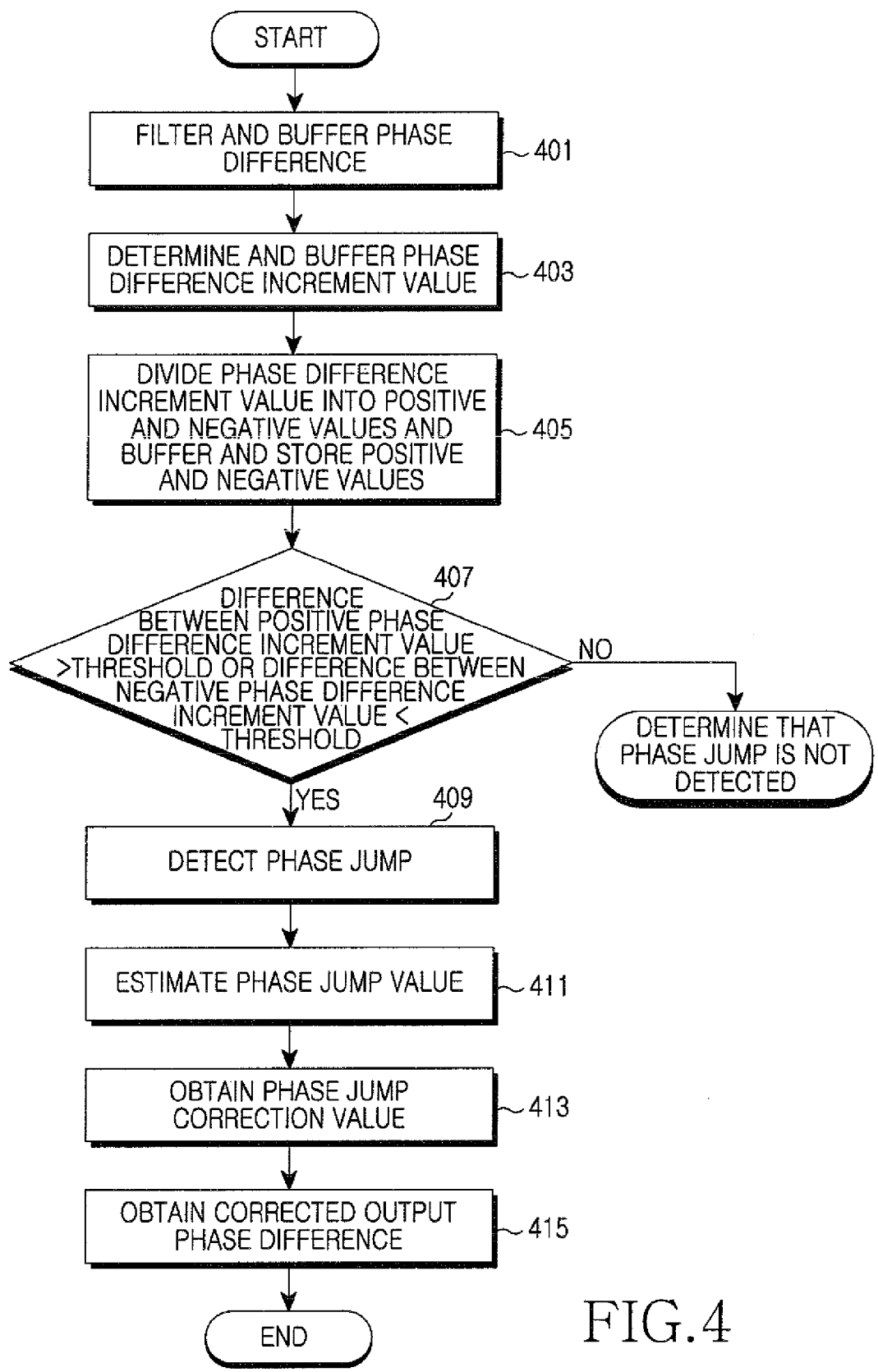
FIG. 4 is a flowchart illustrating a method of compensating for a phase jump of a reference signal, performed by a phase jump compensator according to an exemplary embodiment of the present invention.

FIG. 4 is a flowchart illustrating a method of compensating for a phase jump of a reference signal, performed by the phase jump compensator 105 of FIG. 1 according to an exemplary embodiment of the present invention.

Referring to FIG. 4, a phase difference input from the phase discriminator 103 of FIG. 1 is filtered and buffered in step 401. In step 403, the phase difference is compared with a previous phase difference to determine and buffer a phase difference increment value. In step 405, the phase difference increment value is compared with a threshold, for example, 0 to divide the phase difference increment value into a positive phase difference increment value and a negative phase difference increment value, and then the positive phase difference increment value and the negative phase difference increment value are filtered and buffered.

In step 407, the positive phase difference increment value is compared with the filtered positive phase difference increment value, so as to determine whether a difference between the positive phase difference increment value and the filtered positive phase difference increment value is greater than a threshold. Alternatively, the negative phase difference increment value is compared with the filtered negative phase difference increment value, so as to determine whether a difference between the negative phase difference increment value and the filtered negative phase difference increment value is less than the threshold. If the difference between the positive phase difference increment value and the filtered positive phase difference increment value is greater than the threshold, or if the difference between the negative phase difference increment value and the filtered negative phase difference increment value is less than the threshold, a phase jump is detected in step 409. Otherwise, it is determined that the phase jump is not detected.

In step 411, a previously detected phase jump value is estimated by using values buffered at a previous phase jump moment according to a currently filtered phase difference. That is, the values include the filtered positive phase difference increment value, the filtered negative phase difference increment value, the phase difference increment value, and the filtered phase difference. In other words, a difference A between the filtered positive phase difference increment value and the phase difference increment value is calculated and stored, a difference B between the filtered negative phase difference increment value and the phase difference increment value is calculated and stored, and a difference C between values, which are obtained before and after the filtered phase difference is buffered, is calculated. Further, a difference D between the difference A and the difference C is calculated, and a difference E between the difference B and the difference C is calculated. Thereafter, absolute values of the two differences D and E are compared with each other. If the absolute value of the difference D is less than the absolute value of the difference E, the difference A corresponding to the difference D is estimated as a phase jump value. Otherwise, the difference B corresponding to the difference E is estimated as the phase jump value.

In step 413, the phase jump value is integrated to obtain a phase jump correction value. In step 415, a difference between the obtained phase jump correction value and the filtered phase difference buffered at the previous phase jump moment is calculated to obtain a corrected output phase difference. Thereafter, the procedure of FIG. 4 ends.

Figure 5:
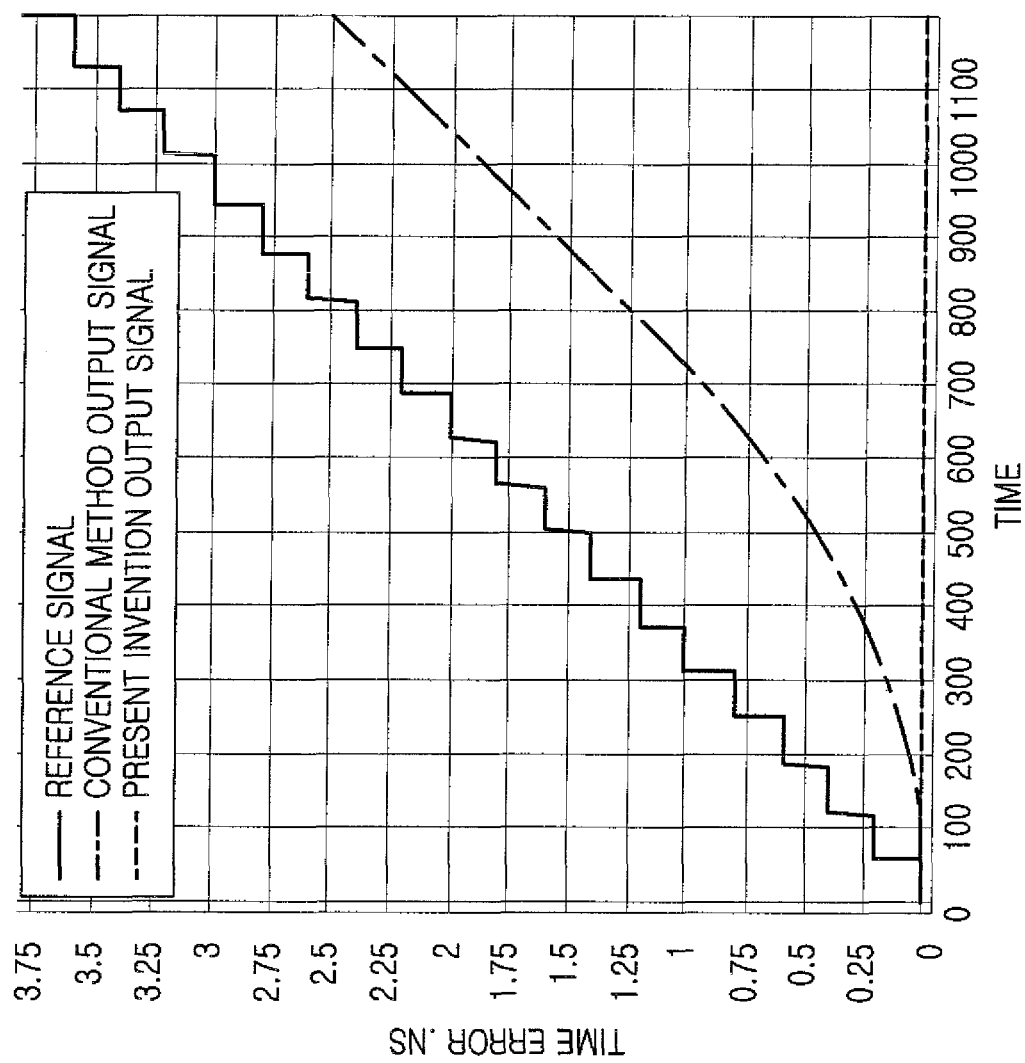
FIG. 5 is a graph illustrating a comparison result of an output phase difference in response to a reference signal in a PLL/FLL of an exemplary embodiment of the present invention with respect to a conventional method.

FIG. 5 is a graph illustrating a comparison result of an output phase difference in response to a reference signal in a PLL/FLL of an exemplary embodiment of the present invention with respect to a conventional method.

Referring to FIG. 5, when the reference signal jumps by more than 0.2 nanoseconds for every 60 seconds, the conventional method does not compensate for a phase jump of the reference signal. That is, in the conventional method, an output phase difference illustrates that a phase of the reference signal varies as the phase jump occurs in the reference signal. However, in an exemplary embodiment of the present invention, an output phase difference illustrates that the phase of the reference signal does not change. That is, the graph illustrates that phase jump is removed according to an exemplary embodiment of the present invention.

According to an exemplary embodiment of the present invention, a phase jump compensator is additionally disposed between a phase discriminator and a VCO to compensate for a phase jump of a reference signal. Therefore, a phase jump occurring in the reference signal can be compensated for, thereby providing a reliable PLL/FLL output signal. That is, reliable synchronization can be achieved over an E1/T1 network. Further, a clock jitter character as well as call quality of a terminal can be improved.

While the invention has been shown and described with reference to certain exemplary embodiments thereof, it will be understood by those skilled in the art that various changes in form and details may be made therein without departing from the spirit and scope of the invention as defined by the appended claims and their equivalents. Therefore, the scope of the invention is defined not by the detailed description of the invention but by the appended claims and their equivalents, and all differences within the scope will be construed as being included in the present invention.

What is claimed is:

1. An apparatus for compensating for a phase jump of a reference signal, the apparatus comprising:
    a phase discriminator for comparing a phase of the reference signal with a phase of an internal clock signal to determine a phase difference between the two signals;
    a phase jump compensator for detecting a phase jump moment by using the phase difference, for estimating a previous phase jump value according to a current phase difference upon detecting a phase jump, and for correcting the phase difference by using a phase jump correction value obtained in the estimation process; and a Low Pass Filter (LPF) for filtering a high-frequency component of the corrected phase difference.

2. The apparatus of claim 1, wherein the reference signal comprises an external signal.

3. The apparatus of claim 1, further comprising:
an integrator for generating at least one of voltage and current which is in proportion to the phase difference by integrating the filtered phase difference;
a Digital-to-Analog Converter (DAC) for converting the at least one of voltage and current into at least one of analog voltage and current;
a Voltage-Controlled-Oscillator (VCO) for outputting a frequency corresponding to the filtered phase difference by using the converted at least one of voltage and current; and
a frequency divider for dividing the frequency and for outputting the divided frequency to the phase discriminator to facilitate phase comparison performed by the phase discriminator.

4. The apparatus of claim 1, wherein the phase jump compensator comprises:
a phase differentiator for obtaining a phase difference increment value by comparing the determined phase difference obtained by the phase discriminator with a previous phase difference;
a first comparator for comparing the phase difference increment value with a threshold to divide the phase difference increment value into a positive phase difference increment value and a negative phase difference increment value;
a first LPF for filtering the determined phase difference output from the phase discriminator;
a second LPF for filtering the positive phase difference increment value and the negative phase difference increment value;
a second comparator for comparing the positive phase difference increment value with the filtered positive phase difference increment value, for comparing the negative phase difference increment value with the filtered negative phase difference increment value, and for detecting the phase jump; and
a phase jump value estimator for buffering the phase difference increment value, the filtered phase difference, the filtered positive phase difference increment value, and the filtered negative phase difference increment value, for estimating a previously detected phase jump value by using a value buffered at a previous phase jump moment according to a currently filtered phase difference upon detecting a phase jump, and for correcting the phase difference by using the phase jump correction value obtained in the estimation process.

5. The apparatus of claim 4, wherein the second comparator detects the phase jump when at least one of a difference between the positive phase difference increment value and the filtered positive phase difference increment value is greater than a threshold and a difference between the negative phase difference increment value and the filtered negative phase difference increment value is less than the threshold.

6. The apparatus of claim 4, wherein the phase jump value estimator further comprises:
a buffer for buffering the phase difference increment value, the filtered phase difference, the filtered positive phase difference increment value, and the filtered negative phase difference increment value;

a subtractor for estimating a previously detected phase jump value according to a currently filtered phase difference by using a value buffered at the previous phase jump moment upon detecting the phase jump;
an integrator for integrating the phase jump value to obtain the phase jump correction value;
a combiner for calculating a difference between the filtered phase difference stored at the previous phase jump moment and the phase jump correction value to obtain a corrected output phase difference.

7. The apparatus of claim 6, wherein the phase jump value estimator further comprises a comparator for comparing phase differences and outputting a phase jump value.

8. The apparatus of claim 6, wherein the subtractor comprises:
means for calculating and storing a difference A between the filtered positive phase difference increment value and the phase difference increment value, for calculating and storing a difference B between the filtered negative phase difference increment value and the phase difference increment value, and for calculating a difference C between values obtained before and after the filtered phase difference is buffered;
means for calculating a difference D between the difference A and the difference C and for calculating a difference E between the difference B and the difference C;
means for comparing absolute values of the two differences D and E, and if the absolute value of the difference D is less than the absolute value of the difference E, for selecting the difference D, and otherwise, for selecting the difference E; and
means for outputting to the integrator either the difference A or the difference B corresponding to the selecting as a phase jump value, and for resetting the buffer.

9. A method of compensating for a phase jump of a reference signal, the method comprising:
comparing a phase of the reference signal with a phase of an internal clock signal using a phase discriminator to determine a phase difference between the two signals;
detecting a phase jump moment by using the phase difference in a phase jump compensator, estimating a previous phase jump value according to a current phase difference upon detecting a phase jump, and correcting the phase difference by using a phase jump correction value obtained in the estimation process; and
filtering a high-frequency component of the corrected phase difference using a Low Pass Filter (LPF).

10. The method of claim 9, wherein the reference signal comprises an external signal.

11. The method of claim 9, further comprising:
generating at least one of voltage and current which is in proportion to the phase difference by integrating the filtered phase difference;
converting the at least one of voltage and current into at least one of analog voltage and current;
outputting a frequency corresponding to the filtered phase difference by using the converted at least one of voltage and current; and
dividing the frequency and outputting the divided frequency to facilitate phase comparison.

12. The method of claim 9, wherein the correcting of the phase difference comprises:
obtaining a phase difference increment value by comparing the determined phase difference with a previous phase difference;
dividing the phase difference increment value into a positive phase difference increment value and a negative phase difference increment value by comparing the phase difference increment value with a threshold;

filtering the determined phase difference, the positive phase difference increment value, and the negative phase difference increment value, and buffering the phase difference increment value, the filtered phase difference, the filtered positive phase difference increment value, and the filtered negative phase difference increment value;

comparing the positive phase difference increment value with the filtered positive phase difference increment value, comparing the negative phase difference increment value with the filtered negative phase difference increment value, and detecting the phase jump; and upon detecting the phase jump, estimating a previously detected phase jump value by using a value buffered at a previous phase jump moment according to a currently filtered phase difference, and correcting the phase difference by using the phase jump correction value obtained in the estimation process.

13. The method of claim 12, wherein the phase jump is detected when at least one of a difference between the positive phase difference increment value and the filtered positive phase difference increment value is greater than a threshold and a difference between the negative phase difference increment value and the filtered negative phase difference increment value is less than the threshold.

14. The method of claim 12, wherein the correcting of the phase difference comprises:

estimating a previously detected phase jump value according to a currently filtered phase difference by using a value buffered at a previous phase jump moment upon detecting the phase jump;

obtaining the phase jump correction value by integrating the phase jump value; and obtaining a corrected output phase difference by calculating a difference between the filtered phase difference stored at the previous phase jump moment and the phase jump correction value.

15. The method of claim 14, wherein the estimating of the previously detected phase jump value comprises:

calculating and storing a difference A between the filtered positive phase difference increment value and the phase difference increment value, calculating and storing a difference B between the filtered negative phase difference increment value and the phase difference increment value, and calculating a difference C between values obtained before and after the filtered phase difference is buffered;

calculating a difference D between the difference A and the difference C and calculating a difference E between the difference B and the difference C;

comparing absolute values of the two differences D and E, and if the absolute value of the difference D is less than the absolute value of the difference E, selecting the difference D, and otherwise, selecting the difference E; and outputting to the integrator either the difference A or the difference B corresponding to the selecting as a phase jump value, and resetting the buffer.

* * * * *